United States Patent [19]

Hayashi et al.

[11] 3,710,041

[45] Jan. 9, 1973

[54] ELEMENT WITH TURN-ON DELAY AND A FAST RECOVERY FOR A HIGH SPEED INTEGRATED CIRCUIT

[75] Inventors: Yutaka Hayashi; Yasuo Tarui, both of Tokyo, Japan

[73] Assignee: Kogyo Gijutsuin, (a/k/a Agency of Industrial Science and Technology, Ministry of International Trade and Industry, Japanese Government, Tokyo-to, Japan

[22] Filed: March 18, 1971

[21] Appl. No.: 125,788

Related U.S. Application Data

[62] Division of Ser. No. 809,654, March 24, 1969, abandoned.

[30] Foreign Application Priority Data

March 25, 1968 Japan ................................43/18984
April 21, 1968 Japan ................................43/23973

[52] U.S. Cl. ....................307/300, 307/237, 307/317
[51] Int. Cl.............................H03k 3/33, H03k 5/08
[58] Field of Search.......................307/237, 300, 317

[56] References Cited

UNITED STATES PATENTS

| | | | |
|---|---|---|---|
| 3,463,975 | 8/1969 | Biard | 307/317 X |
| 3,105,159 | 9/1963 | Ditkofsky | 307/300 X |

FOREIGN PATENTS OR APPLICATIONS

| | | | |
|---|---|---|---|
| 215,148 | 11/1957 | Australia | 307/237 |

OTHER PUBLICATIONS

"Transistor Saturation Control" by Benima in RCA Technical Notes, RCA TN No. 552, Mar. 1964, pages (2 sheets)

*Primary Examiner*—Stanley D. Miller, Jr.
*Attorney*—Holman and Stern

[57] ABSTRACT

A fast recovery delay element of an integrated circuit comprising a series connection of a "majority carrier diode" and at least one PN junction diode of conventional construction, said element being simple in structure and having a high utility in a high speed switching circuit of high efficiency.

2 Claims, 7 Drawing Figures

Inventors:
YUTAKA HAYASHI
YASUO TARUI
ATTORNEYS:
HOLMAN & STERN

ELEMENT WITH TURN-ON DELAY AND A FAST RECOVERY FOR A HIGH SPEED INTEGRATED CIRCUIT

This application is a division of application Ser. No. 809,654, filed Mar. 24, 1969, now abandoned.

BACKGROUND OF THE INVENTION

A clamping circuit including a Schottky barrier diode (which will be denoted hereinafter as SBD) which is operable as a saturation type of high speed switch is known. In this circuit, a non-linear negative feedback consisting of the SBD is provided for a transistor for the purpose of preventing it from entering into the saturation range, and a far higher speed operation of the switching circuit is expected.

Although this kind of conventional circuit can accomplish switching of about 1 nsec., the conventional circuit nevertheless is accompanied by the following drawbacks:

1. Because of its directly provided negative feedback from the output terminal to the base terminal, ringing (transient) is easily caused in its output waveform.

2. When the load current is comparable to the input current, the operation is not satisfactory because the input current to the base of the transistor tends to flow directly to the collector without fully driving the transistor to its saturation range for any short time. It is more effective that the whole input current flows into the base at the switching transient period of time. For this purpose, the non-linear negative feedback by the element with delay characteristics is desirable. As shown in FIG. 1, which illustrates a PN junction in schematic form, the effective resistance of the diode can be varied at a time-constant equivalent to or slower than the operational speed of the transistor if the concentration of the impurities in the PN junction and the physical size thereof are both suitably selected. The reason for this is that the minority carriers are injected from the P layer into the N layer or vice versa, and the series resistance of the PN junction is varied with time due to the conductivity modulation caused thereby.

On the other hand, high-frequency components of the input signal, which are higher than those corresponding to the time-constant of the PN junction diode, are attenuated within the PN junction diode.

As is apparent from the above description, if the PN junction diode is properly designed, a non-linear negative feedback with a desired time delay can be applied to a transistor. However, such an application of the PN junction diode is, on the other hand, accompanied by the storage of minority carriers therein and decreases the recovery speed of the circuit.

SUMMARY OF THE INVENTION

An object of this invention is to provide a fast recovery delay element of an integrated circuit by a series connection of a majority carrier diode and at least one PN junction with slower turn-on and recovery time.

Another object of this invention is to provide an integrated switching circuit with high switching efficiency and stability by using said delay element in a feedback path in said integrated circuit.

DETAILED DESCRIPTION OF THE INVENTION

Figure 1:
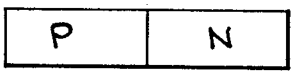
FIG. 1 is a schematic diagram showing the construction of a conventional PN junction diode.
Figure 2:
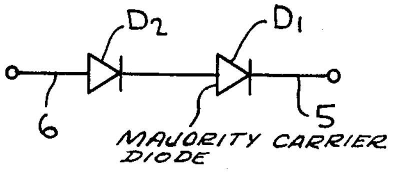
FIG. 2 is a diagram showing the principle of this invention.

According to the invention, the above-mentioned difficulty involved in the conventional clamping circuit including a SBD can be solved by a series connection of the "majority carrier diode" $D_1$ and at least one PN junction diode $D_2$ as shown in FIG. 2. The PN junction diode $D_2$ functions as a delaying element in this circuit. With the diode $D_1$, the recovering time in the reversed direction operation can be equalized to the high speed recovering time of the "majority carrier diode", whereby both of the objects for obtaining delayed feedback and high speed operation of the circuit can be achieved. Such an application of the invention will be hereinafter described with respect to examples wherein the element as shown in FIG. 2 is employed in integrated circuits.

Figure 3:
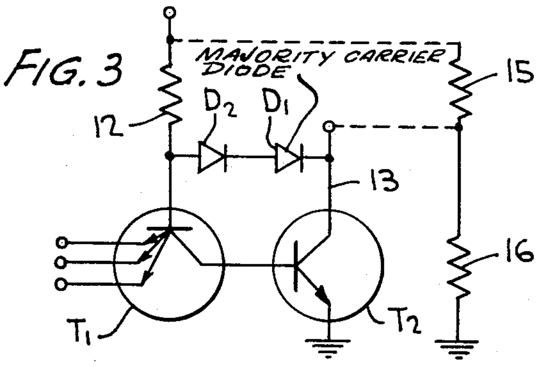
FIG. 3 shows an example of application of this invention to a transistor-transistor logic.

FIG. 3 illustrates an example comprising a conventional transistor-transistor logic (TTL) wherein the feedback circuit according to one aspect of the present invention is employed. In this example, transistors $T_1$ and $T_2$ are of the type 2N5275 made by Fairchild Co., U.S.A., and a resistor 12 of 400 ohms are employed. For the PN junction diode $D_2$, the base emitter junction of type 2N4275 transistor is utilized. The "majority carrier diode" is a type 2301 of Hewlet-Packard Co., U.S.A.. In an actual instance of this example, a stepped pulse was applied, and the response was measured across a load consisting of resistors 15 and 16 of 200 and 450 ohms, respectively.

Figure 4:
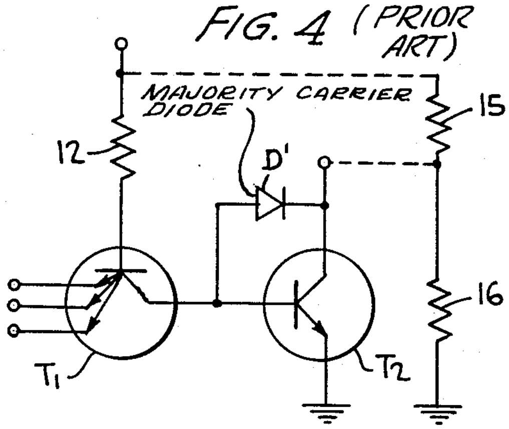
FIG. 4 (PRIOR ART)
FIG. 4 shows a conventional transistor-transistor logic wherein the Schottky barrier diode clamp is employed.
Figure 5:
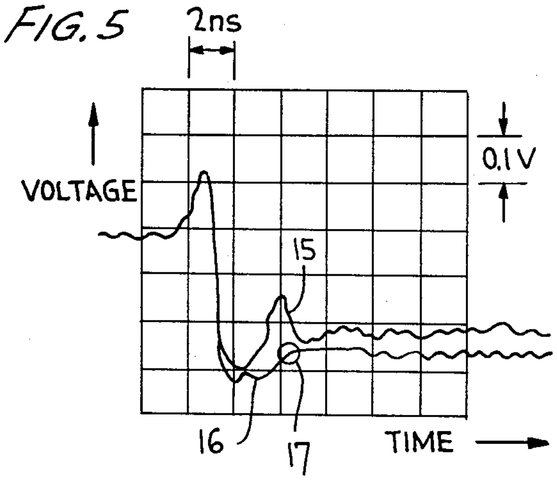
FIG. 5 is a waveform diagram obtained from an experimental results and showing the particular advantages of the present invention.
Figure 6:
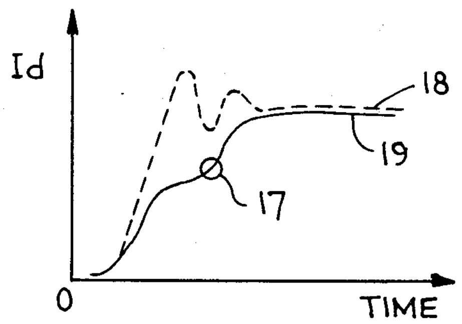
FIG. 6 is an explanatory diagram of the operational principle of this invention.

FIG. 4 is another example wherein a conventional TTL clamped by the SBD is composed of circuit elements equivalent to those in FIG. 3. In an actual instance of practice, the stepped pulse response of this circuit was also measured in the same manner as described above, and the results obtained for both cases of FIG. 3 and FIG. 4 were compared. These results are indicated in FIG. 5, where the waveform obtained with the example in FIG. 3 is represented by a waveform 16 and that with the example in FIG. 4 is represented by the waveform 15.

As is apparent from these waveforms, the waveform 15 corresponding to FIG. 4 includes a significant ringing (transient), whereas the waveform 16 shows substantially no ringing. Furthermore, up to the point 17 encircled, a weaker current flows through the diodes, and this fact in turn allows the load current to be switched at a sufficiently higher speed, and the resultant signal transferring speed of the TTL can be substantially increased even if a plurality of such TTL are connected in a multitude of stages.

The above-described examples of the comparison of the performance between the circuits shown in FIGS. 3 and 4 may be embodied in an integrated circuit wherein the external connections of an integrated circuit are allowed to change the circuit connection in both ways. The values of (Power) x (average propagation delay) were measured for both of the connections at their highest allowable operational speed, and the results indicated that the value obtained for the conventional construction was 75 mW.nS and that for the circuit according to one aspect of this invention was 37 mW.nS.

In the integrated circuit, since it is possible to fabricate the PN junction diode $D_2$ in the same region of the integrated circuit as of the multi-emitter transistor $T_1$ in FIG. 3, complication of the construction is thereby avoided and the increase in area due to the addition of the PN junction diode $D_2$ is negligible when it is compared with the whole area of the integrated circuit.

In DIG. 6, characteristic curves 18 and 19 showing relations between time and diode current $I_d$ are shown, said curves 19 and 18 corresponding to the examples of FIG. 3 and FIG. 4, respectively, and the point 17 encircled corresponding to the point 17 in FIG. 5. The curve 19 shows the delay of the feedback current through the series connection of a PN junction diode $D_2$ and a majority carrier diode $D_1$.

Figure 7:
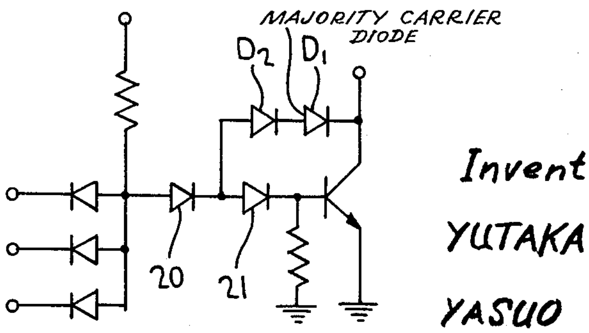
FIG. 7 shows an example of application of this invention to a diode-transistor logic.

The feedback circuit according to one aspect of this invention is also useful in increasing the operational speed of a saturation type switching circuit, for instance, of a DTL as shown in FIG. 7. In this case, it is more advantageous if the conductivity modulation in the PN junction diode $D_2$ is made larger than or at least equal to that of the level shift diodes 21 and 20.

The PN junction diode $D_2$ connected in series with the "majority carrier diode" $D_1$, in various application, is not always limited in number to one, but a plurality of the PN junction diodes may also be connected, and these arrangements are also included in the scope of this invention.

Accordingly, what is claimed is:

1. A fast recovery delay element for connection between the input and output paths of a transistor switching device, said fast recovery delay element consisting of a majority carrier diode and at least one PN junction diode connected in series with said majority carrier diode and poled with its forward direction in the same direction as the more conductive direction of said majority carrier diode, said PN junction being slower in turn-on time and in recovery time than said majority carrier diode.

2. A circuit component comprising at least one transistor having base, emitter and collector circuit portions, and clamping circuit means defining a fast recovery delay element for said transistor, said clamping circuit means comprising a majority carrier diode and at least one PN junction diode connected in series with said majority carrier diode and poled with its forward direction in the same direction as the more conductive direction of said majority carrier diode, said PN junction being slower in turn-on time than said majority carrier diode and the transistor, and being slower in recovery time than said majority carrier diode, said fast recovery delay element being coupled between said collector and base circuit portions of said transistor with the polarity of said PN junction of said delay element being the same as the polarity of the collector-base diode of said transistor.

* * * * *